United States Patent [19]

Schat

[11] 4,037,119
[45] July 19, 1977

[54] CHARGE TRANSFER DELAY CIRCUIT FOR ANALOG SIGNALS

[75] Inventor: Hermannus Schat, Freiburg, Germany

[73] Assignee: ITT Industries, Inc., New York, N.Y.

[21] Appl. No.: 588,072

[22] Filed: June 18, 1975

[30] Foreign Application Priority Data

June 25, 1974 Germany .............................. 2430349

[51] Int. Cl.$^2$ ....................... H03K 5/13; G11C 19/00; H03K 3/353
[52] U.S. Cl. ................................. 307/293; 307/221 C; 307/221 D; 307/304
[58] Field of Search ............... 307/221 C, 221 D, 304, 307/293; 357/23, 24

[56] References Cited

U.S. PATENT DOCUMENTS

| | | | |
|---|---|---|---|
| 3,764,824 | 10/1973 | Sangster | 307/221 C |
| 3,873,851 | 3/1975 | Weimer | 307/221 C |
| 3,913,077 | 10/1975 | Erb | 328/37 |
| 3,914,748 | 10/1975 | Barton et al. | 357/24 |

Primary Examiner—Stanley D. Miller, Jr.
Attorney, Agent, or Firm—John T. O'Halloran; Peter C. Van Der Sluys; Vincent B. Ingrassia

[57] ABSTRACT

The area of an integrated delay line comprising charge transfer circuits (charge-coupled circuits and bucket brigade circuits) is minimized by arranging the stages in such a manner that between two longitudinal chains of stages there lie n/2 transversal chains, n being the number of stages of one longitudinal chain.

4 Claims, 2 Drawing Figures

CHARGE TRANSFER DELAY CIRCUIT FOR ANALOG SIGNALS

BACKGROUND OF THE INVENTION

This invention relates to a charge transfer circuit and, more particularly, to bucket brigade and charge-coupled circuits.

Summarizing representations concerning charge transfer circuits or devices, can be found in the technical journal "Elektronik", 1974, pp. 3 to 8, and in the technical journal "Internationale Elektronische Rundschau", 1973, pp. 239 to 244. With the aid of these circuits, it is known to delay analog signals, hence e.g. ac voltages of any optional waveform, or individually occurring signals, and thus store them temporarily. In so doing, the analog signal is quantized in accordance with the sampling theorem, and amounts of charge corresponding to the individual quantizing stages, are shifted within the charge transfer circuits by means of clock signals.

With charge transfer circuits, there may be considered on one hand, the so-called bucket brigade circuits and, on the other hand, the charge-coupled circuits.

Bucket brigade circuits comprise a plurality of similar stages each consisting of a transistor and of a capacitor arranged between the gate terminal and the collector terminal thereof, and are arranged in series in such a way that the collector terminal of the one is connected to the emitter terminal of the next following transistor, with the gate terminals of the even-numbered transistors being controlled by a first portion of the rectangular or sawtooth shaped clock signal while the gate terminals of the odd-numbered transistors are controlled by a second portion of the rectangular or sawtooth shaped clock signal. The two portions of the clock signal are of equal frequency and in such a way assigned to one another that the effective pulses of the one portion will come to lie in the gaps between the effective pulses of the other portion.

Bucket brigade circuits may be realized with the aid of discrete components, as well as in the form of integrated circuits. In the course of this it is possible to use transistors either of the bipolar type, as well as field-transistors, and in the latter case it is of particularly advantage to use insulated-gate field-effect transistors, so that for the integrating purpose there is employed the so-called MOS technology.

The charge-coupled circuits are exclusively realizable in integrated form, because they do without the capacitor as an individual structure as used in the bucket brigade circuits, and because its effect is replaced by a corresponding arrangement of the electrodes and by correspondingly selecting the clock signal waveform.

The characteristic feature of the function of such charge transfer circuits resides in the fact that in the one clock signal phase, the even-numbered stages contain an analog signal voltage value while the odd-numbered stages, however, contain a neutral voltage value, whereas in the following clock signal phase, the odd-numbered stages have an analog signal voltage value and the even-numbered stages have a neutral voltage value.

To the delay time $t$ of such charge transfer circuits, there applies the simple formula:

$$t = \frac{n}{2f_T},$$

wherein $n$ indicates the number of stages of the charge transfer circuit, and $f_T$ indicates the frequency of the clock signal. Accordingly, the delay time $t$ is directly in proportion to the number of stages $n$, whereas the frequency of the clock signal, via the sampling theorem, has insofar an influence upon the delay time as the latter becomes reduced the higher the frequency is of the signal to be delayed and consequently, the higher the frequency is to be chosen of the clock signal, hence that in the case of an equal delay time for both low and high frequency signals, the number of stages therefor has to be enlarged.

Increasing the number of stages, however, presents certain problems. The charge transport along charge transfer circuits is susceptible to interferences in such a way that, at the end of the circuit, greater portions of the charge quantities go astray, which represent the analog signals. This loss of charge, of course, may be compensated for by so-called regenerating circuits, but these regenerating circuits require additional space which is undesirable in the case of integrated circuits. Moreover, the unlimited increase in the number of stages during integration is restricted by the fact that the manufacturing yield of functionable integrated circuits is inversely in proportion to the required crystal surface of the integrated circuit. Accordingly, above a certain number of stages, manufacture is either not at all possible, or at least not economical.

SUMMARY OF THE INVENTION

It is an object of the present invention to avoid the above disadvantages and to provide charge transfer circuits, which, when realized in the form of integrated circuits and when providing for the same crystal surface as in conventional circuits, enable a considerably larger number of stages and, when realized with the aid of discrete devices, require substantially less devices for the same number of stages of conventional charge transfer circuits.

According to a broad aspect of the invention, there is provided a charge transfer delay circuit for delaying analog signals wherein there is provided a first longitudinal chain (K) of series-connected identical stages operated by first clock signal in such a way that in a first clock signal phase, the even-numbered stages contain an analog signal voltage value, while the odd-numbered stages contain a neutral voltage value, whereas during the following clock signal phase, the odd-numbered stages contain an analog signal voltage value and the even-numbered stages contain a neutral voltage value comprising: a plurality of transversal chains ($Q_1$, $Q_{2n}$, $Q_{k-1}$, $Q_k$) each comprising an identical number ($n$) of series-connected stages, each of said plurality of transversal chains connected to a different alternate stage of said first longitudinal chain; means for applying auxiliary clock signals ($\phi_{3,1}$, $\phi_{3,2}$, $\phi_{3,n-1}$, $\phi_{3,n}$) to each of the $n$ stages of said plurality of transversal chains, all stages in the transversal chains occupying a similar position in its respective chain being coupled to the same auxiliary clock signal, for activating the $n$ stages of said first plurality of transversal chains, one at a time in turn; a second longitudinal chain (K') of series-arranged identical stages, alternate stages of which are coupled to a different one of said plurality of transversal chains; and means for applying second clock signals to the stages of said second longitudinal chain.

The invention is based on the idea of reducing the number of those stages containing a neutral voltage value, by a different arrangement of the individual stages which, during integration, also leads to a different area arrangement of the individual stages.

The above and other objects of the present invention will be more clearly understood from the following detailed description taken in conjunction with the accompanying drawings, in which:

DESCRIPTION OF THE PREFERRED EMBODIMENT

Figure 1:
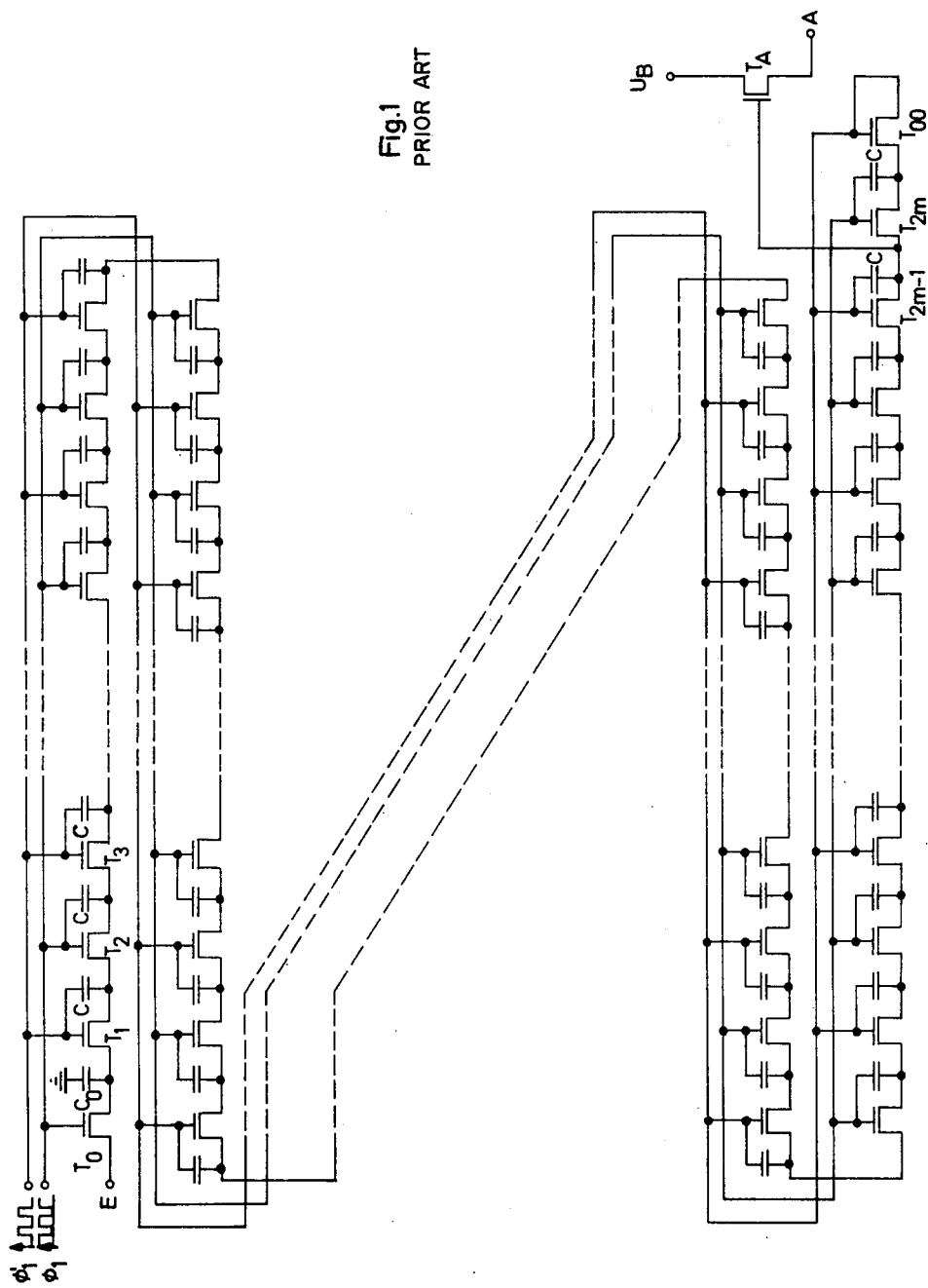
FIG. 1 shows a conventional type of bucket brigade circuit employing 2n stages.

In FIG. 1, is an example relating to a charge transfer circuit. There is shown a conventional type of bucket brigade circuit consisting of insulated-gate field-effect transistors with the corresponding capacitors. For this purpose it is possible to use p-channel or n-channel transistors, depending on what integration technology or what voltage polarities appear to be most suitable for the specific application. The same also applies to the selection of enhancement or depletion type field-effect transistors.

From the entire arrangement of the bucket brigade circuit which, as is well known, may comprise hundreds of stages, there are shown in FIG. 1, amongst others, the transistors $T_0$, $T_1$, $T_2$, $T_3$, $T_{2m-1}$, $T_m$ and $T_{00}$. These transistors are arranged together with the associated capacitors $C_0$, C, in the way described hereinabove, and are series connected. The even-numbered transistors $T_0$, $T_2$, $T_{2m}$ are switched via their gate electrodes by the clock signal $\phi_1$, and the odd-numbered transistors $T_1$, $T_3$, $T_{2m-1}$, $T_{00}$ are switched via their gate electrodes by the clock signal $\phi'_1$.

Each of these clock signals $\phi_1$, $\phi'_1$, consists of a square or rectangular and equifrequent voltage which is referred to the zero point of the circuit, with the amplitude of the one clock signal lying in the gap between the effective pulses of the other clock signal, and vice versa. Each of the clock signals may have a 0.5 pulse duty factor, but is it also possible to choose a pulse duty factor deviating therefrom in such a way that gaps appear between the effective pulses of the two clock signals, during which both clock signals are zero.

The analog signal which is to be delayed or stored, is applied to the input E which is coupled to the controlled current path of the input transistor $T_0$. The other end of this current path is connected to the input capacitor $C_0$ whose other terminal is applied to the zero point of the circuit.

The last delaying stage of the bucket brigade circuit according to FIG. 1 is the stage containing the transistor $T_{2m-1}$, with the two last transistors $T_{2m}$, $T_{00}$ serving to terminate the bucket brigade circuit with respect to direct and alternating current. The one terminal of the controlled current path of the transistor $T_{00}$ is connected to its gate electrode. The delayed or stored analog signal is taken off at the point connecting the controlled current paths of the two last transistors $T_{2m-1}$, $T_{2m}$ and controls the output transistor $T_A$ which, with its controlled current path, is coupled between the supply voltage $U_B$ and the output terminal A.

To this bucket brigade circuit there apply the aforementioned considerations regarding the number of stages and the possibility of being realized in the form of an integrated circuit.

Figure 2:
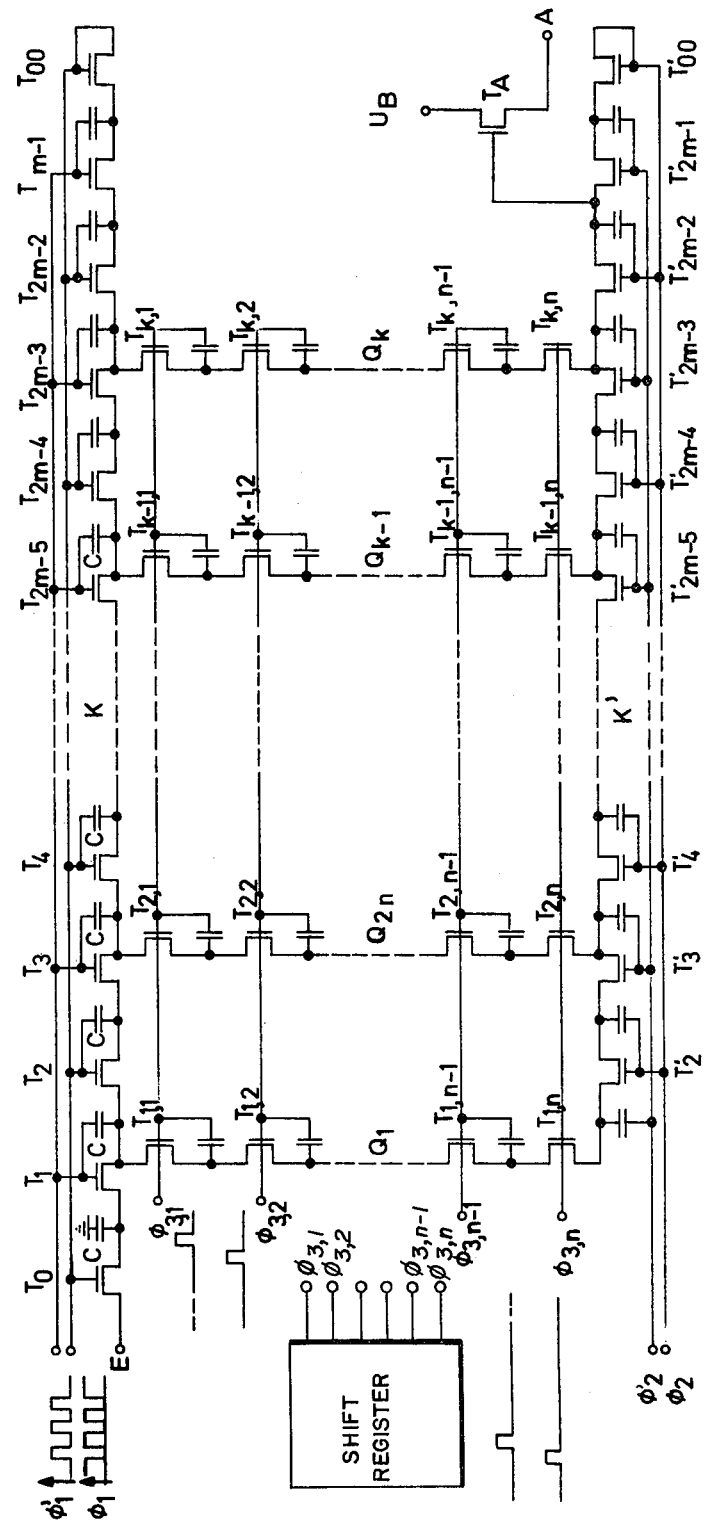
FIG. 2 shows a bucket brigade circuit designed according to the invention.

The embodiment of the invention shown in FIG. 2 does not have the disadvantages of the conventional arrangement. In fact, the embodiment according to FIG. 2 likewise refers to an arrangement according to the bucket brigade circuit principle, but it is clear that the invention may also be applied to the aforementioned charge-coupled devices in a corresponding manner.

The bucket brigade circuit according to FIG. 2, consists of the first longitudinal chain K, of the transversal chains $Q_1$, $Q_2$, $Q_{k-1}$, $Q_k$, and of the second longitudinal chain K'. The first longitudinal chain K is built up in the same way as the bucket brigade circuit according to FIG. 1, i.e., it consists of the transistors $T_0$, $T_1$, $T_2$, $T_3$, $T_4$, $T_{2m-5}$, $T_{2m-4}$, $T_{2m-3}$, $T_{2m-2}$, $T_{2m-1}$, $T_{00}$. The longitudinal chain K, contains an odd number of delaying stages. The longitudinal chain K is operated by the clock signals $\phi_1$, $\phi'_1$, with the analog signal to be delayed again being applied to the input E.

In the embodiment of FIG. 2, according to the invention, a transversal chain of identical stages is connected to each odd-numbered transistor of the first longitudinal chain K, hence to the transistors $T_1$, $T_3$, $T_{2m-5}$, $T_{2m-3}$, namely the transversal chains $Q_1$, $Q_2$, $Q_{k-1}$, $Q_k$. No transversal chain is connected to transistor $T_{2m-1}$ because this transistor is not of the delaying type.

Each transversal chain consists of the same number of n stages and each forms a bucket brigade circuit owing to the series arrangement of its individual stages.

The gate electrodes of the transistors of identical stages in the transversal chains are connected to one another according to the invention, and extend to one input terminal. Thus, $\phi_{3,1}$, is coupled to the transistors $T_{1,1}$, $T_{2,1}$, $T_{k-1,1}$, $T_{k,1}$ of the first transversal chain stages. In a similar way $\phi_{3,2}$ is coupled to the transistors $T_{1,2}$, $T_{2,2}$, $T_{k-1,2}$ $T_{k,2}$ in the second transversal chain stages. The same also applies to the (n-1)-th transversal chain transistors $T_{1,n-1}$, $T_{2,n-1}$, $T_{k-1,n-1}$, $T_{k,n-1}$, which are coupled to the terminal $\phi_{3,n-1}$, as well as to the n-th transversal chain stages comprising the transistors $T_{1,n}$, $T_{2,n}$, $T_{k-1,n}$, $T_{k,n}$, which are coupled to the terminal $\phi_{3,n}$.

According to the invention, the outputs of the individual transversal chains are now connected to the second longitudinal chain K which, is substantially identical to the first longitudinal chain K. The second longitudinal chain K' contains the transistors $T'_2$, $T'_3$, $T'_4$, $T_{2m-5}'$, $T_{2m-4}'$, $T_{2m-3}'$, $T_{2m-2}'$, $T_{2m-1}'$, $T_{00}'$.

The outputs of the individual transversal chains are connected at the point connecting the controlled current path of the respective odd-numbered transistor to its associated capacitor in the second longitudinal chain K'. Thus, the output of the transversal chain $Q_1$ is connected to the terminal of the capacitor belonging to the first odd-numbered transistor of the second longitudinal chain K', $T_1$. The output of the second transversal chain $Q_2$, hence the transistor $T_{2,n}$ is applied to the point connecting the controlled current path of transistor $T'_3$ to the associated capacitor and likewise the corresponding outputs of the transversal chains $Q_{k-1}$, $Q_k$ with the transistors $T_{k-1,n}$, $T_{k,n}$ are applied to the transistors $T'_{2m-5}$, $T'_{2m-3}$.

The point connecting the controlled current paths of the penultimate transistor $T'_{2m-1}$ and of the third to last transistor $T'_{2m-2}$ again control the output transistor $T_A$ as in FIG. 1, which is coupled with its controlled current path between the supply voltage $U_B$ and the output A. The transistor $T'_{00}$, by having its gate terminal connected to the controlled current path, effects the direct-current termination of the second longitudinal chain K'.

The second longitudinal chain K' is controlled by the clock signal $\phi_2$, $\phi'_2$ which, with respect to its waveform, may be identical to that of the clock signal $\phi_1$, $\phi'_1$ but may have a different frequency as compared thereto. In cases of practical application in which it is not necessary to take the entire storage contents immediately off the output A, the frequency of the second clock signals $\phi_2$, $\phi'_2$ may be lower than that of the clock signals $\phi_1$, $\phi'_1$. In cases where already stored information overwritten by the following information, such overwritting is can be avoided by correspondingly controlled the storage device, for example, by temporarily stopping the quicker clock signal.

The terminals of the identical stages in the transversal chains $Q_1 \ldots Q_k$ are supplied by the auxiliary clock signal with the partial clock signals $\phi_{3,1}$, $\phi_{3,2}$, $\phi_{3,n-1}$, $\phi_{3,n}$, activating the individual stages of the transversal chain successively one at a time in turn, as is indicated by the pulse scheme shown on the left in FIG. 2, with the individual pulses being staggered with respect to one another.

An n-stage shift register whose n parallel outputs are connected to the n common terminals of the transversal chains provides a suitable auxiliary clock generator. This shift register may be operated in such a way that one single stage is set whose information rotates in direction from the n-th to the first stage, correspondingly controlled by a third clock signal. It is also possible, however, to set several stages of the shift register, hence, for example, at least two or a number of odd-numbered stages, etc., which should possibly be equally distributed over the entire number of stages, and to let this information rotate in the shift register.

The mode of operation of the example of embodiment shown in FIG. 2 is as follows. After the first longitudinal chain K has been filled with signal values, the charges as contained in the signal-filled capacitors are transferred to the capacitors of the first stages of the transversal chains $Q_1 \ldots Q_k$ by a corresponding timely assignment of the pulses of the first and the third clock signal. After a new filling of the first longitudinal chain K with signal values, and by a corresponding control with the aid of the clock signals, the information as contained in the first stages of the transversal chains is again transferred to the second stages, and the information contained in the first longitudinal chain K is transferred to the first stages of the transversal chains. This is performed continuously, so that gradually all stages of the transversal chains are filled with signals. After reaching the n-th stages of the transversal chains, the information thereof, in the course of the next clock signal step, is transferred to the corresponding stages of the second transversal chain K' from where this information, controlled by the second clock signal $\phi_2$, $\phi'_2$ is transferred to the output A.

Since a transfer to the transversal chains only becomes necessary after the first longitudinal chain K has been filled, the transfer from transversal chain stages to transversal chain stages may take considerably more time than possible in a conventional type of charge transfer circuit, i.e., the frequency of the third clock signal may be substantially lower than the frequency of the first clock signal. In view of this fact it is also possible to do without transversal chain stages storing neutral voltage values and to provide merely a corresponding transversal chain for every second stage of the first longitudinal chain.

During transfer from the one to the next stages of the transversal chains, of course, a neutral voltage value migrates from the end of the transversal chains in a series of identical stages through the transversal chains, as is also known from the explanation of the mode of operation of the bucket brigade circuit, with the voltage values corresponding to the signal being imagined as passing through the chain from the beginning to the end, and with the neutral voltage values being imagined as passing through the chain from the end to the beginning. In particular, this takes place in such a way that, after all signal values of the second longitudinal chain K' have reached the output, all capacitors of the last transversal chain stages will transfer simultaneously their signal contents to the capacitors of the second longitudinal chain K', thus assuming a neutral voltage value. Thereupon, all capacitors of the penultimate transversal chain stages transfer their signal values to the capacitors of the last transversal chain stages, thereby assuming a neutral voltage value. This process continues up to the first transversal chain stages, in that the signal values step by step and in a series-parallel manner are shifted downwardly and with one transversal row with neutral values being shifted upwardly until the latter reach the first longitudinal chain K. As a rule, the clock signal control merely safeguards that at this particular time, the first longitudinal chain is just filled with signals.

Accordingly, the number of capacitors containing neutral voltage values is reduced in the delay circuit according to the invention to one single row of identical stages of the transversal chains, with this reduction having a particularly favorable effect upon the required crystal surface in the case of integration, when the proportion of transversal chains is large compared to the proportion of longitudinal chains.

In cases where the total time of passage in the transversal chains is too long for certain practical applications, it is possible for several identical stages of the transversal chains to be passed through by neutral voltage values, thus reducing the transfer time. This is achieved by the aforementioned embodiment of the third clock signals, in which case more than one stage is set in the shift register which, for example, serves as the auxiliary clock pulse generator.

Another advantage of the (charge transfer) delay circuit according to the invention is to be seen in that a certain signal value only passes through a part of the total number of provided stages. The aforementioned imperfection as regards the takeover of the charge during each transfer of the signal value, therefore, has a much smaller effect upon the output signal than in conventional arrangements where each signal value has to pass through all stages.

While the principles of the invention have been described above in connection with specific apparatus, it is to be clearly understood that this description is made only by way of example and not as a limitation on the scope of the invention.

What is claimed is:

1. A charge transfer delay circuit for delaying analog signals wherein there is provided a first longitudinal chain (K) of series-connected indentical stages operated in such a way that in a first clock phase, the even-numbered stages, switched by a first clock signal, contain an analog signal voltage value, while the odd-numbered stages, switched by a second clock signal, contain a neutral voltage value, whereas during the following clock phase, the odd-numbered stages contain an analog signal voltage value and the even-numbered stages contain a neutral voltage value comprising:

a plurality of transversal chains ($Q_1$, $Q_{2n}$, $Q_{k-1}$, $Q_k$) each comprising an identical number (n) of series-connected stages, each of said plurality of transversal chains connected to a different alternate stage of said first longitudinal chain;

an $n$ stage shift register for generating and applying $n$ auxiliary clock signal ($\phi_{3,1}$, $\phi_{3,2}$, $\phi_{3,n-1}$, $\phi_{3,n}$), one to each of the $n$ stages of said plurality of transversal chains, all stages in the transversal chains occupying a similar position in its respective chain being coupled to the same stage of said n-stage shift register, for activating the $n$ stages of said first plurality of transversal chains, one at a time in turn;

a second longitudinal chain (K') of series-arranged identical stages, alternate stages of which are coupled to a different one of said plurality of transversal chains; and means for applying a third clock signal to the even stages of said second longitudinal chain and a fourth clock signal to the odd numbered stages of said second longitudinal chain.

2. A circuit according to claim 1, wherein said first and second clock signals ($\phi_1$, $\phi'_1$; $\phi_2$, $\phi'_2$) are of equal frequency.

3. A circuit according to claim 1 wherein said second clock signals ($\phi_2$, $\phi'_2$) are of lower frequency than the first clock signals ($\phi_1$, $\phi'_1$).

4. A circuit according to claim 1 wherein said means for applying is an auxiliary clock signal generator.

* * * * *